United States Patent [19]

Kogure

[11] 4,410,827
[45] Oct. 18, 1983

[54] MODE COUPLED NOTCHED TUNING FORK TYPE QUARTZ CRYSTAL RESONATOR

[75] Inventor: Shigeru Kogure, Suwa, Japan

[73] Assignee: Kabushiki Kaisha Suwa Seikosha, Tokyo, Japan

[21] Appl. No.: 257,296

[22] Filed: Apr. 24, 1981

[30] Foreign Application Priority Data

Apr. 24, 1980 [JP] Japan .................................. 55-54811
Oct. 28, 1980 [JP] Japan .................................. 55-150598

[51] Int. Cl.³ ................................................ H01L 41/08
[52] U.S. Cl. ................................ 310/370; 310/351; 310/352
[58] Field of Search ............... 310/367, 370, 351–353, 310/348

[56] References Cited

U.S. PATENT DOCUMENTS

| Re. 29,429 | 10/1977 | Kawai et al. ............ 310/370 X |
| 3,683,213 | 8/1972 | Staudte ................... 310/370 X |
| 3,697,766 | 10/1972 | Ganter et al. ............ 310/370 X |
| 4,023,055 | 5/1977 | Tsukada .................... 310/370 |
| 4,191,906 | 3/1980 | Kogure ..................... 310/370 |

FOREIGN PATENT DOCUMENTS

| 2267160 | 7/1975 | France ................. 310/370 |
| 52-48485 | 4/1977 | Japan .................. 310/370 |
| 54-7285 | 1/1979 | Japan .................. 310/370 |
| 54-112191 | 9/1979 | Japan .................. 310/370 |
| 54-138395 | 10/1979 | Japan .................. 310/370 |
| 55-42421 | 3/1980 | Japan .................. 310/370 |
| 55-46636 | 4/1980 | Japan .................. 310/370 |
| 479987 | 2/1938 | United Kingdom . |
| 2006520 | 5/1979 | United Kingdom ... 310/370 |

*Primary Examiner*—Mark O. Budd
*Attorney, Agent, or Firm*—Blum, Kaplan, Friedman, Silberman & Beran

[57] ABSTRACT

A mode coupled tuning fork type quartz crystal resonator is mounted to a plug using support members of selected contour and dimensions to prevent acoustic energy loss from the plug and to avoid reduction in Q factor. A bend of 180 degrees in the support member and controlled length are factors in isolating fundamental and first overtone vibrations in flexure and fundamental torsional vibrations so as to reduce energy loss, maintain stable oscillation and improve the Q factor. A laterally extended base portion and/or tapered ends of the tuning fork arms enhance the beneficial results.

28 Claims, 36 Drawing Figures

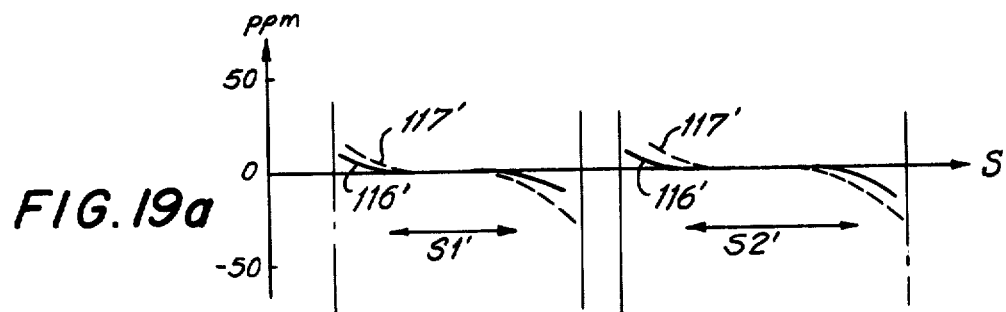

MODE COUPLED NOTCHED TUNING FORK TYPE QUARTZ CRYSTAL RESONATOR

BACKGROUND OF THE INVENTION

This invention relates generally to a mode coupled tuning fork type quartz crystal resonator of the type used in electronic circuitry such as timepieces, more particularly, to a mounted mode coupled tuning fork type quartz crystal resonator which is isolated by the mounting to prevent loss of energy and reduction in oscillatory Q factor. If the lower part of the tuning fork base, that is, the portion excepting the two tuning fork arms, is made completely stationary, there will be no leakage of energy at this lower edge. However, to utilize this method, the displacements in the base portion of the resonator must be small and the mass of the supporting system must be greater than that of the resonator. Otherwise, a leakage of acoustic energy occurs. Another method to prevent the vibrations of the resonator from being induced into the mounting plug is by lengthening the support members which connect the plug to the base portion of the tuning fork. This can be beneficial even though displacements in the tuning fork base portion increase to some degree.

These methods are practically suitable to prevention of loss of energy in the flexural fundamental vibrational mode, but these methods are not applicable to isolating the flexural overtone frequency. Further, these methods are never used in a mode mode coupled tuning fork type quartz crystal resonator where displacements of the flexural overtone or the coupled vibrational mode are significantly large as compared to the displacements of the flexural fundamental vibration. When these methods have been applied to such vibrational modes, the characteristics of Q, crystal impedance and frequency changes due to aging have been less favorable. Especially for a mode coupled tuning fork type quartz crystal resonator, it is desirable that the acoustic leak of the torsional vibrational mode be completely eliminated.

What is needed is a mounted mode coupled tuning fork type quartz crystal resonator having good energy loss isolation in the fundamental flexural and torsional modes of vibration as well as in the overtone mode of flexural vibration.

SUMMARY OF THE INVENTION

Generally speaking, in accordance with the invention, a mounted mode coupled tuning fork type quartz crystal resonator especially isolated to prevent energy losses is provided. The resonator is mounted to a plug using support members of selected contours and dimensions to prevent acoustic energy in the resonator from being transmitted to the plug and then to the mounting or any object which contacts the plug. A bend of 180 degrees in the support members and a controlled length are factors in isolating fundamental and first overtone vibrations in flexural and fundamental torsional vibrations. The tuning fork base is also contoured to prevent energy transmission to the plug by means of lateral extensions, end recesses, and tapering the free ends of the tuning fork arms. Good energy isolation is maintained in spite of normal production vibrations in the construction of the support members.

Accordingly, it is an object of this invention to provide an improved mounted mode coupled tuning fork type quartz crystal resonator which has low energy losses through the mounting system.

Another object of this invention is to provide an improved mounted mode coupled tuning fork type quartz crystal resonator which maintains a high Q value and low crystal impedance unaffected by the mounting.

A further object of this invention is to provide an improved mounted mode coupled tuning fork type quartz crystal resonator which has a stable oscillation frequency and stable vibrational amplitude.

Still another object of this invention is to provide an improved mounted mode coupled tuning fork type quartz crystal resonator which is isolated from shocks and impacts.

Yet another object of this invention is to provide an improved mounted mode coupled tuning fork type quartz crystal resonator which suppresses energy losses in both the flexural and torsional modes of vibration and improves the Q factor of tuning fork type vibrators.

Still other objects and advantages of the invention will in part be obvious and will in part be apparent from the specification.

The invention accordingly comprises the features of construction, combination of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 1b is an elevational view of the resonator of FIG. 1a;

FIG. 17b indicates the effect on vibrational frequency of lateral base dimensions as defined in FIG. 17a;

FIG. 18b indicates the effects of dimensional change on vibrational frequency of the resonator of FIG. 18a; and FIGS. 19a–d show characteristics similar to FIGS. 10a–d for a resonator of FIG. 18a mounted in accordance with the construction of FIG. 9.

DESCRIPTION OF THE PREFERRED EMBODIMENTS

This invention relates to a mode coupled tuning fork type quartz crystal resonator which as a result of mode coupling has an improved resonant frequency-temperature characteristic for one of two coupled vibrational modes. In particular, the variations in the resonant frequency of a selected vibrational mode because of temperature variations is diminished by coupling two vibrational modes of the tuning fork type vibrator.

In a mode coupled tuning fork type quartz crystal resonator in accordance with this invention, a flexural vibration and torsional vibration are selected from the many modes of vibrations, to be coupled. When the two selected vibrational modes are coupled, the resonant frequency-temperature characteristics of the flexural vibration is improved, that is, the flexural vibration is considered as the primary vibrational mode. When such a coupled resonator is used in an electronic timepiece, the accuracy in timekeeping is improved. A mode coupled tuning fork type quartz crystal resonator utilizing a coupling between a flexural and a torsional vibrational mode is described in detail in Japanese laid-open patent No. 116191/79, 75325/80, and 75326/80, corresponding to U.S. patent application Ser. No. 42,732, filed May 29, 1979, which is incorporated herein by reference.

Either a fundamental vibration or an overtone of flexural vibration can be used for coupling. From the viewpoint of improving the timekeeping accuracy of an electronic timepiece, it is preferable to use an overtone flexural vibration because there is little aging in the resonant frequency and the Q value of the overtone is generally higher than that of the fundamental vibration. Also, the overtone frequency varies less than the fundamental vibration depending upon the orientation of the resonator relative to the direction of the gravity field.

Although an overtone has such advantages, it is preferable to use the lowest overtone, that is, the first overtone, becuase the power consumed, for example, in an electronic timepiece, to maintain the oscillations increases directly with the frequency. A mode coupled tuning fork type quartz crystal resonator in which a first overtone in flexure is coupled to a fundamental torsional vibration is described herein.

Figure 1A:
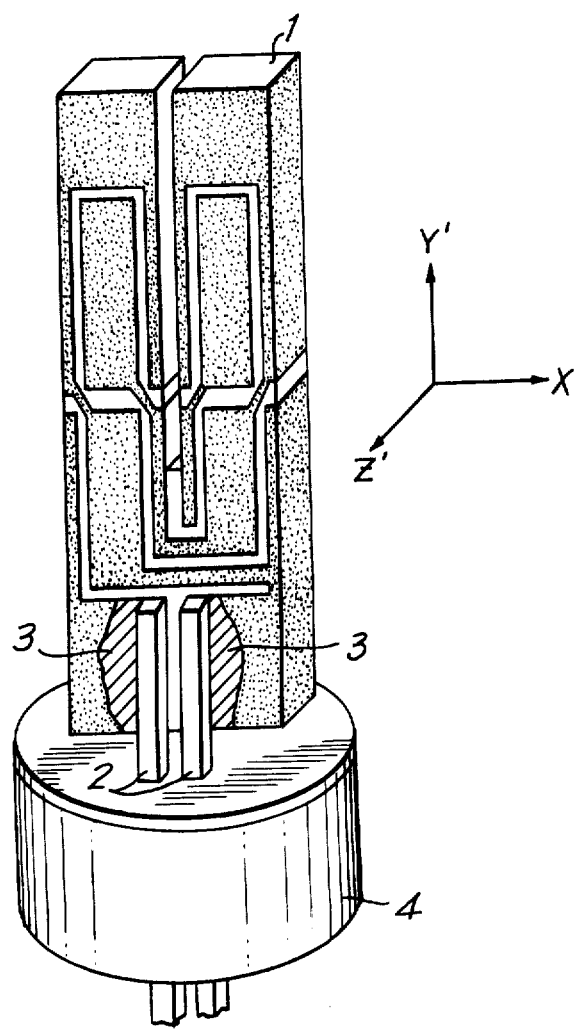
FIG. 1a is a perspective view of a mode coupled tuning fork type quartz crystal resonator mounted on a base or plug.

FIG. 1a illustrates a mode coupled tuning fork type quartz crystal resonator as disclosed in the aforementioned Japanese applications. The mode coupled tuning fork type quartz crystal resonator includes the resonating leaf 1 supported by a pair of support members or posts 2 which also provide electrical connection to the electrodes formed on the surfaces of the resonator leaf 1. The support members 2 are connected to the leaf 1 by means of solder 3 and the ends of the support members 2 connect with a plug 4. The X, Y' and Z' axes of FIG. 1 show respectively the electrical axis of a quartz crystal, the mechanical axis rotated about the electrical axis, and the optical axis rotated about the electrical axis. The width of the quartz crystal resonator leaf 1 is parallel with X axis. The length of the tuning fork resonator 1 is parallel to the Y' axis, and the thickness of the resonator 1 is parallel to the direction of the Z' axis. Actual cutting angles are described in the aforementioned Japanese laid-open patent No. 75325/80 and 75326/80, as well as in the U.S. application.

Generally speaking, the Q value of a first overtone of flexural vibration is higher than that of the fundamental flexural vibration. However, because the physical vibrational displacements of the lower base portion of the tuning fork type resonator are substantial, it has been difficult to obtain in practice the inherent high Q value for the first flexural overtone when using a supporting method as shown in FIG. 1a. Consequently, it has been difficult to utilize the natural advantage of a first overtone, that is, low aging of the resonant frequency.

Figure 1B:
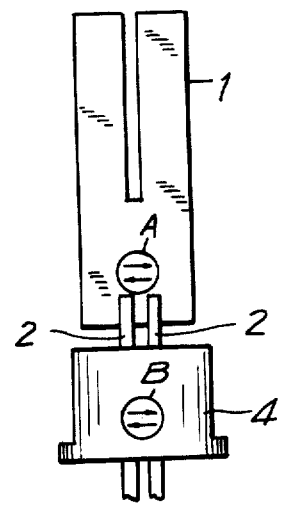

The relationship of decreasing Q value and acoustic leakage to the manner of supporting the resonator leaf 1 is explained with reference to FIG. 1b. The resonator leaf 1, support members 2 and plug 4 are the same as in FIG. 1a. The arrows A indicate that the base portion of the tuning fork type resonator is physically vibrating. The arrows B indicate that the plug 4 is also vibrating as a result of the energy transmitted from the resonator 1 through the support members 2 to the plug 4. As shown in FIG. 1b, when the vibrational amplitude in the mounting portion where the support members 2 connect to the resonator leaf 1, is high, the resonator 1 causes the plug 4 to vibrate. Thus, when the vibrational amplitude of the mounting is high, the loss of vibrational energy is high and the Q value of oscillation is decreased. Further, in accordance both with actual practice and with the theory of vibration, when a mass is added at a location where vibrational amplitude is finite, that is, not zero, such that the equivalent mass is not infinite, the frequency of the vibrating system decreases. In particular, additional mass if added to the plug 4 when the plug 4 is vibrating causes the resonant frequency of the resonator leaf 1 to decrease. When mass is added to the plug 4, the plug moves in an unstable manner and the resonant frequency of the resonator leaf 1 varies in an unstable manner. This is the mechanism by which acoustic leakage occurs.

Displacements in the X, Y' and Z' directions on the base portion of the resonator leaf 1 are defined respectively as UX, UY' and UZ'. In a mode coupled tuning fork type quartz crystal resonator, UY' and UZ' are especially great. By comparison, UY' is two or three orders of magnitude larger than UX. UZ' is an order of magnitude larger than UX. Since the base portion of the leaf 1 in which displacement UY' and UZ' are high, is supported by the two support members 2 as shown in FIGS. 1a,b, the quartz crystal resonator leaf 1 causes the plug 4 to vibrate along with the vibration source.

Accordingly, when another object touches against the plug 4, friction occurs between the plug and other object so that vibrational energy is lost and the so-called acoustic leak occurs which decreases the Q value and increases the crystal impedance. When the acoustic leak is large, the amplitude of vibration and the frequency of oscillation are fairly unstable.

A mounted mode coupled tuning fork type quartz crystal resonator in accordance with this invention is free of such a defect. High Q values are maintained and the amplitude of vibration and the oscillation frequency is stable. Further, the mounted resonator has a performance which is resistant to mechanical shocks and impacts.

Figure 2:
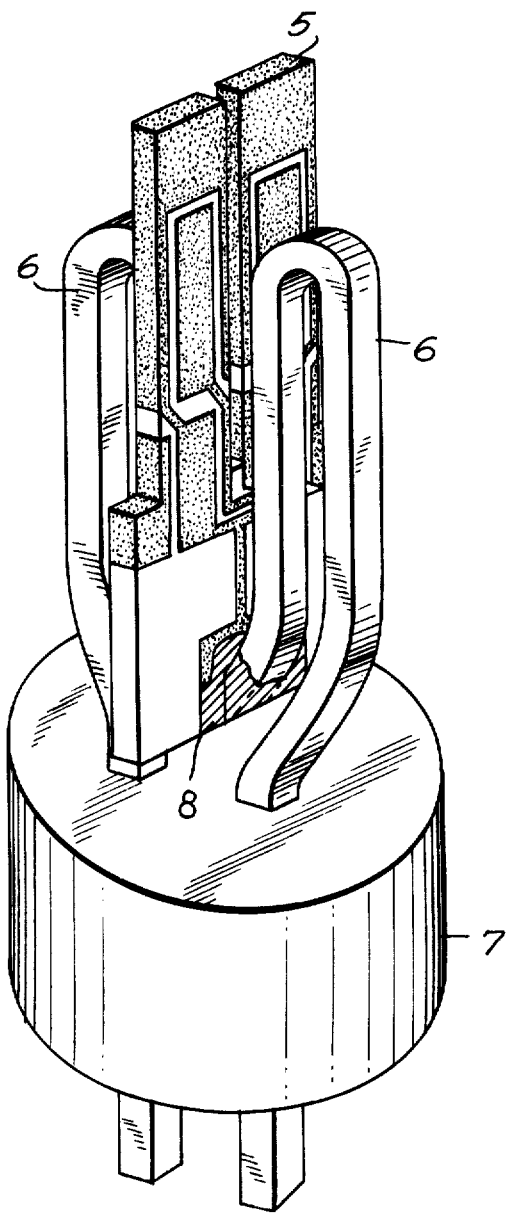
FIG. 2 is a perspective view of a mounted mode coupled tuning fork type quartz crystal resonator in accordance with this invention.

FIG. 2 shows a mounted mode coupled tuning fork type quartz crystal resonator in accordance with this invention. The mounted resonator includes a mode coupled tuning fork type quartz crystal resonator leaf 5, connected to a pair of support members 6. The mounted resonator also includes a plug 7 to which the support members 6 are connected, and solder 8 which connect the support members 6 to the mode coupled tuning fork type quartz crystal resonator leaf 5 so as to provide an electrically conductive joint between the support members 6 and the electrodes which are formed on the resonator leaf 5. The support members 6 include a 180 degree bend and connect near the lower end of the resonator leaf 5. An improvement in Q value and stability in vibrational amplitude and frequency is achieved, as explained with reference to FIGS. 3a,b,c and FIG. 4.

Figures 3A, 3B, 3C:
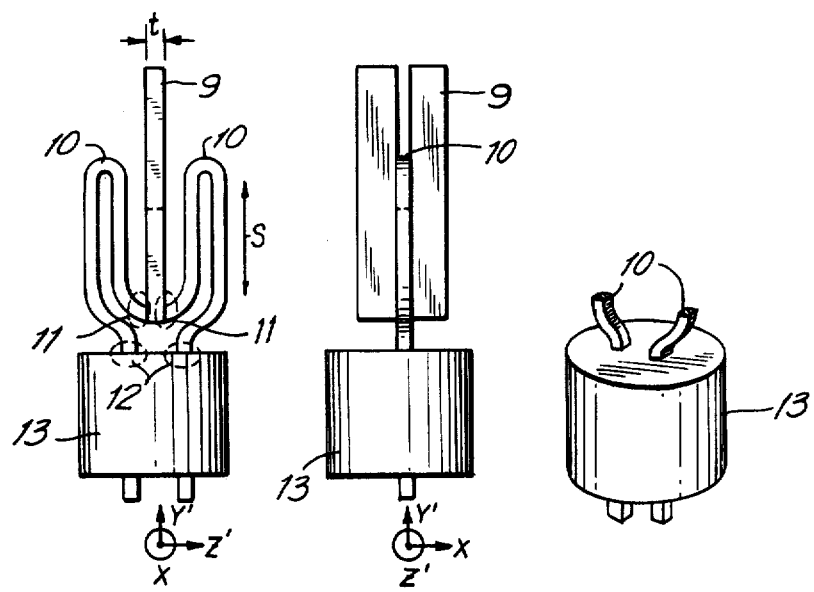
FIGS. 3a,b are side and front elevational views respectively of a mounted resonator similar to that of FIG. 2.
FIG. 3c is a partial perspective view of the resonator of FIGS. 3a, b.

FIGS. 3a,b,c illustrate a side and elevational view respectively of a mounted mode coupled tuning fork type quartz crystal resonator similar to that of FIG. 2, and a perspective view of the plug mounting. A mode coupled tuning fork type quartz crystal resonator leaf 9 is held in position by a pair of support members 10 engaging opposite faces at the base of the tuning fork leaf 9 in mounting zones 11. The support members 10 connect to a plug 13 in mounting zones or areas 12. It should be noted that the resonator leaf 9 of FIGS. 3a,b differs from the resonator leaf 5 of FIG. 2 in that the lateral extensions of the base portion of the resonator leaf 5 are not present in the resonator leaf 9.

Figure 4:
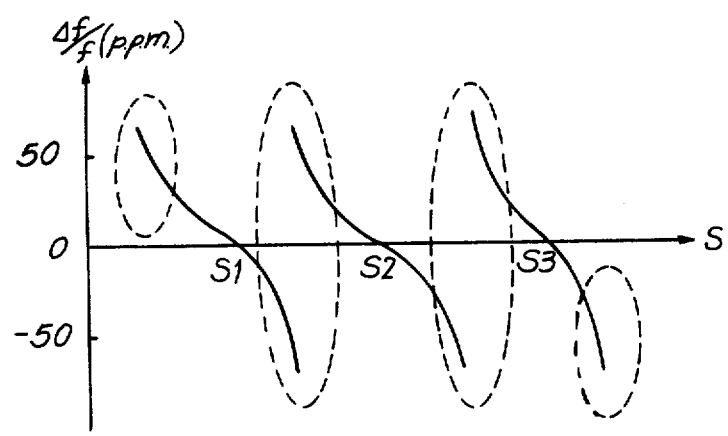
FIG. 4 shows the variations in oscillatory frequency versus the length dimension of the support members of FIGS. 3a,b,c.

Obviously, the mode coupled tuning fork type quartz crystal resonator leaf 9 is a vibrating material and the support members 10 can also be fabricated of a vibrating material. Because the two vibrating materials are connected at the mounting zones 11, coupling occurs between the resonator leaf 9 and the support members 10. FIG. 4 illustrates degrees of this mechanical coupling as explained more fully hereinafter.

The abcissa S of FIG. 4 is shown in FIG. 3a and is the length of a straight portion on the support members 10. The ordinate axis of FIG. 4 shows the frequency variation as a proportion of the resonant frequency of the mode coupled tuning fork type quartz crystal resonator. Thus, the solid lines of FIG. 4 represent the variations in the frequency of the vibrator 9 as the length S is varied. When the mounting zones 11 are completely fixed, that is, they have no vibrational displacement, coupling does not occur between the resonator leaf 9 and the plug 13 and the frequency of the quartz crystal resonator 9 remains at a constant value independently of any change in the length S. However, in practice, there are displacements at the mounting zones 11 which can be large and the coupling between the support members 11 and the resonator leaf 9 varies and the frequency of the quartz crystal resonator 9 varies when the length S of the support member 11 is changed. Also, as the vibrating displacement of the mounting zones 11 is high, even when the vibration amplitude decays a bit in the support members 10, a vibration is transmitted to the plug 13 and the plug 13 vibrates. Accordingly, when another object is touched against the plug 13, friction axis between them. As a result, vibratory energy is lost to the other object and the Q value of oscillation decreases and the crystal impedance increases. Further, as the vibration system including the support members 10 and plug 13 changes, the frequency of the quartz crystal resonator 9 coupled with the support members 10 also changes. Such an acoustic leak occurs most strongly in the most intense coupling zones enclosed by the broken lines of FIG. 4. As indicated in FIG. 4, when the length S is selected to have a value close to S1, S2 or S3, the mode coupled tuning fork type quartz crystal resonator has low coupling to the plug 13 and is much improved over a conventional embodiment of a mounted resonator such as shown in FIG. 1.

Vibrational displacements UY', UZ' and UX are present at the mounting zones 11 of the quartz crystal resonator 9. However, by properly choosing the width, thickness, and length S of the support members 10, the displacements UZ' and UX at the mounting zones 12 at the other ends of the support members 10 can be reduced to nearly zero. That is, with regard to the vibrational displacements in the directions of the axes Z' and X, the mounting zones 12 of the support members 10 can be made a nodal point of vibration. However, for the embodiment of FIGS. 3a,b,c the displacement UY' at the mounting zones 12 of the support members 10 cannot be made a nodal point of vibration. This displacement causes the plug 13 to vibrate. Further, as the displacement UY' is the largest of the three displacements, it causes the coupling of the quartz crystal resonator leaf 9 and the support members 10 to be more intense. Accordingly, if the coupling between the quartz crystal resonator 9 and the support members 10 is to be decreased so as not to transmit vibrations to the plug 13, it is necessary to make the displacements UY' small in the mounting zones 11.

Figure 5A:
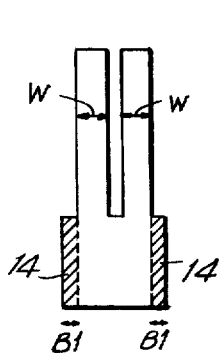
FIGS. 5a,b,c show alternative embodiments of mode coupled tuning fork type quartz crystal resonator leafs in accordance with this invention.
Figure 5B:
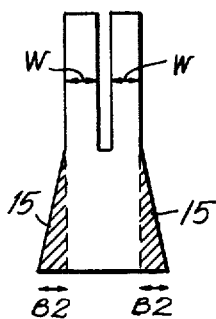
Figure 5C:
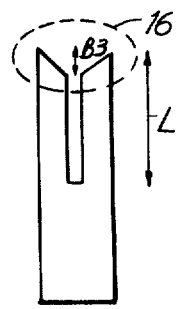

FIGS. 5a,b,c show alternative shapes of resonator leafs in accordance with this invention which make the displacements UY' at the mounting zones 11 to be small. FIG. 5a shows a vibrator leaf provided with rectangular laterally extending portions 14 (shaded) having a width B1 at the base portion of the tuning fork resonator leaf. FIG. 5b shows a resonator having an inclined portions 15 (shaded) laterally extending the tuning fork base portion and having a width B2 at the bottom end of the base portion. FIG. 5c shows a resonator leaf having the inside corners of the free ends of the tuning fork arms tapered over a distance B3. B1 is one-half or less of the width W of the tuning fork arms. B2 is two-thirds or less of the width W of the tuning fork arms, and B3 is one-fifth or less of the length L of the tuning fork arms. When resonator leafs are formed having the dimensions B1, B2 or B3 in the ranges indicated and these resonators are supported by support members 6, 10 as shown in FIGS. 2, 3a,b respectively, the displacement UY' at the mounting zone 11 is reduced almost to the same low value as the displacement UX. If resonator leafs are fabricated having a construction with B1, B2 or B3 greater than the range of preferred values indicated above, the displacements UY' increase adversely. Further, in shaping of a resonator leaf, combinations of FIGS. 5a and 5c and FIGS. 5b and c give satisfactory results. That is, tapering of the arm tips can be combined with lateral extensions from the base portion of the resonator leaf. Resonator leafs in the contours as shown in FIGS. 5a,b,c can be readily manufactured using a photolithographic process.

Figure 6:
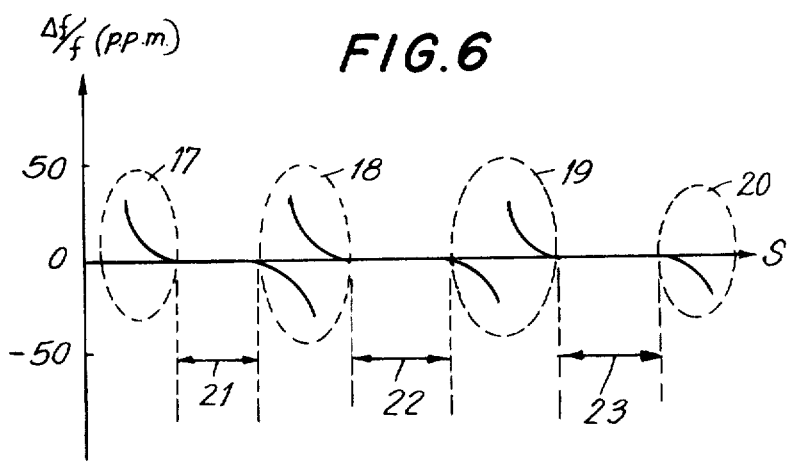
FIGS. 6 shows characteristics similar to FIG. 4 for resonators of FIGS. 5a,b,c after mounting in accordance with this invention.

FIG. 6 is a graph having the same coordinate axes as in FIG. 4, indicating variations of frequency of vibration of a quartz resonator in relation to the straight length S of the support member. FIG. 6 shows the performance of a mode coupled tuning fork type quartz crystal resonator in accordance with this invention as shown in FIGS. 5a,b,c and supported by support members 6, 10 contoured as shown in FIGS. 2 and 3a,b.

The displacements UY' at the mounting zones 11 decrease sufficiently such that coupling between the quartz crystal vibrator leaf and the support members is diminished. Especially, in the ranges 21, 22, 23 of straight length S (FIG. 6) coupling is extremely reduced and in those ranges the frequency of vibration of the quartz crystal resonator maintains almost a constant value. Only when the resonant frequency of the support member itself approaches the resonant frequency of the quartz crystal resonator leaf, does coupling occur as shown within the loops 17,18,19,20 indicated with broken lines in FIG. 6. In the preferred ranges 21,22,23, vibrational displacements at the mounting zones 12 of the support members are small, coupling between the support members and the quartz crystal resonator leaf is diminished and as a result there is no acoustic leak. In the undesired ranges 17,18,19,20 coupling between the support members and the quartz crystal resonator leaf is greatly increased, the plug vibrates with large displacements and an acoustic leakage occurs.

Further, in the preferred ranges 21,22,23 of the support member length S, the resonant frequency does not change even when the joint at the mounting zone 12 is loosened because of some shock, for example, due to dropping or the like. That is to say, a quartz crystal resonator (FIGS. 5a,b,c) designed and mounted for operation in the S ranges 21,22,23 is not adversely affected to any large degree by impulses due to shock.

Figure 7:
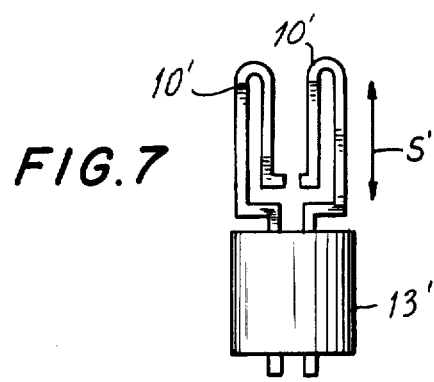
FIG. 7 is a side elevational view of a support system for a mode coupled tuning fork type quartz crystal resonator in accordance with this invention.
Figure 8A:
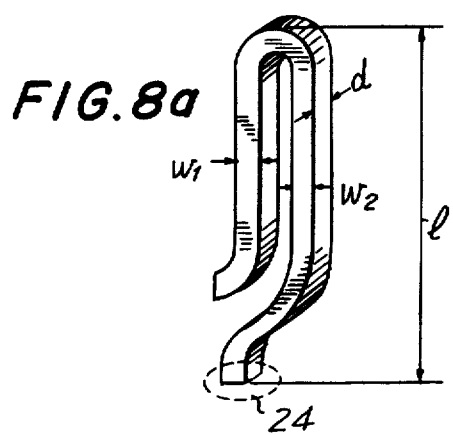
FIGS. 8a,b illustrate the dimensions of the support members of FIGS. 3 and 7.
Figure 8B:
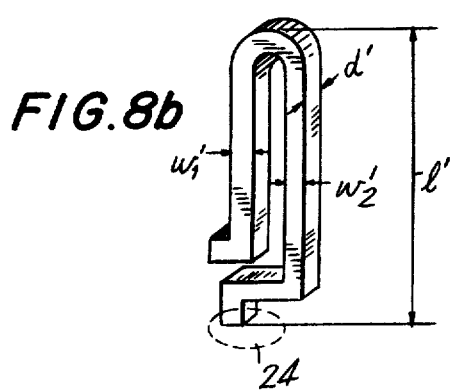

FIG. 7 shows an alternative embodiment of support members 10' connected to a plug 13' and having contours which differ from the support members 6,10 illustrated in of FIGS. 2 and 3a,b,c. The support members 10' of FIG. 7 produce the same beneficial effects as obtained with the other support members when the length dimension S is in a preferred range 21,22,23. Exemplary dimensions for support members of both types which have provided staisfactory isolation from acoustic leakage are presented with reference to FIGS. 8a,b, wherein the height of the support members is represented by l and l' respectively. The thickness of the support members is d and d' respectively, the inside element width is W1 and W1', and the outside element width W2 and W'2. These dimensions vary depending upon the material used for fabrication of the support member or the size of the resonator leaf which is to be supported. When the thickness t of the vibrator leaf (FIG. 3a) is 200 microns or less, and the support members are made from carbon steel, dimensions for the support members of FIGS. 8a,b are as follows:

l, l' = 1.0 to 4.5 mm
W1, W'1 = 0.1 to 0.3 mm
W2, W'2 = 0.1 to 0.3 mm
d, d' = 0.1 to 0.3 mm

When the thickness t of the quartz crystal resonator leaf is 200 microns or and the support member is made from Kovar, a well known iron-nickel-cobalt alloy, the respective dimensions are as follows:

l, l' = 2.5 to 5.0 mm
W1, W'1 = 0.15 to 0.3 mm
W2, W'2 = 0.15 to 0.3 mm
d, d' = 0.15 to 0.3 mm

As stated above, a mounted resonator which has no acoustic leakage and is not affected by impulses from being dropped and the like, can be manufactured by using support members having a bend of 180 degrees with selected dimensions and connected to a resonator leaf which is specially contoured in a manner different from a conventional tuning fork vibrator. Namely, the tuning fork resonator in accordance with this invention includes a rectangular portion extending laterally from the base portion of the leaf, with the lateral extension being half or less than the width of the tuning fork arm. Or, the resonator can be provided with an inclined portion extending laterally from the tuning fork base with the laterally extended portion at its maximum being two-thirds or less of the width of the tuning fork arm. Or, the resonator leaf has the inside corners of the free ends of the tuning fork arms tapered to a length which is one-fifth or less of the length of the tuning fork arms. When a mounted mode coupled tuning fork type quartz crystal resonator is produced in accordance with this invention and has a resonant freqency of approximately 200 kHz, the Q value of oscillation is 300,000 or higher and the crystal impedance value is 2,000 ohms or less. Thus, a mode coupled tuning fork type quartz crystal resonator can be manufactured having little aging in the frequency characteristics.

When a mode coupled tuning fork type quartz crystal resonator in accordance with this invention is adapted to use in an electronic wristwatch, the wristwatch has low power consumption for generation of a standard frequency signal and high accuracy is achieved. Further, this invention is not limited to a mode coupled tuning fork type quartz crystal resonator and can be adapted to other designs of tuning fork type crystal vibrators with good effect.

To this point, the description has been limited to displacements in the direction of the X,Y' and Z' axes, and the torsional vibration to which the flexural vibration is coupled has not been considered. Also, not considered heretofore is the acoustical leakage of energy in this mode, which should be prevented. This is especially important because acoustic leakage of the torsional vibrational energy causes the dispersion of the resonant frequency-temperature characteristics to increase. And when the housing enclosing the resonator is clamped into position, an abnormality in the desired resonant frequency-temperature characteristics may occur. Accordingly, it is necessary that acoustic leakage of energy from the torsional vibrational mode be suppressed. When energy loss is reduced, the Q values of vibration in the mode coupled tuning fork type quartz crystal resonator in accordance with this invention is improved.

Figure 9:
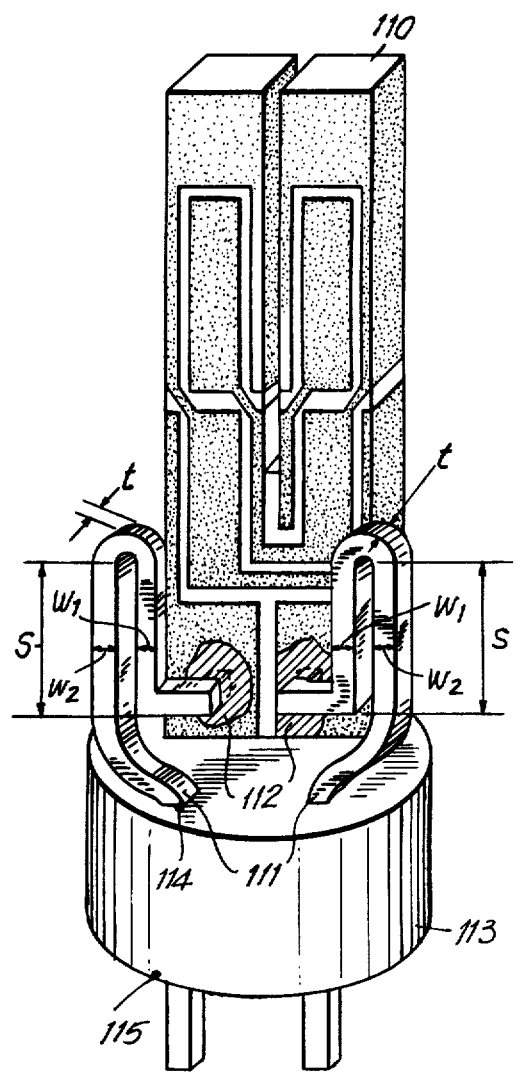
FIG. 9 is a perspective view of an alternative embodiment of a mounted mode coupled tuning fork type quartz crystal resonator in accordance with this invention.

With reference to FIG. 9, a mounted mode coupled tuning fork type quartz crystal resonator in accordance with this invention includes a resonator leaf 110 joined to a pair of supporting members 111 by means of solder 112. The ends of the supporting members 111 are connected to a plug 113. In FIG. 9, dimensions of the supporting member 111 are represented respectively as follows: Length of the straight portion S; thickness t; width of the inside element W1; and width of the outside element W2. For purposes of explanation, 114 is designated as a point of contact between a supporting member 111 and the plug 113. Another point 115 is located on the lower bottom edge of the plug 113.

Figure 10A:
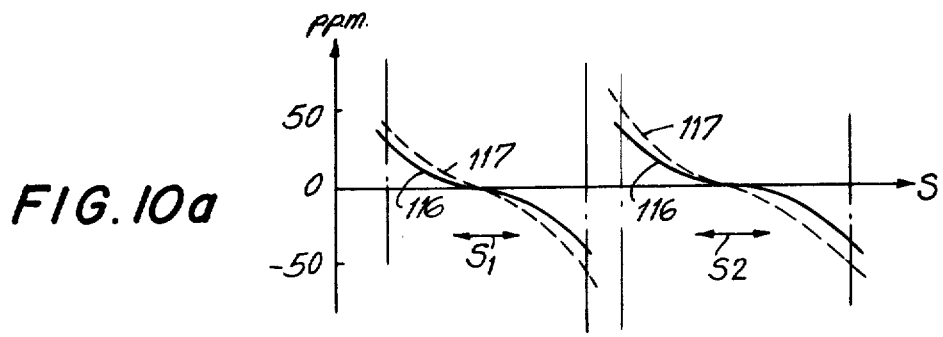
FIGS. 10a,b,c,d show the effects of mounting member length dimension on frequency and displacement in accordance with this invention.

Principles of this invention are explained with reference to FIGS. 10a,b,c,d. FIG. 10a shows the variations in resonant frequency of the flexural mode of vibration and that of the torsional mode of vibration in terms of the straight portion S of the support members 111 when all other dimensions of the support members 111 are held at fixed values and only the dimension S is varied. Curve 116 shows the variation of frequency of the flexural mode of vibration and curve 117 shows the variation in frequency of the torsional mode of vibration. The ordinate indicates the variations of resonant frequency such that a frequency versus straight portion S is presented. Obviously, there are ranges S1, S2 in the dimension S where changes in resonant frequency due to mounting length are minimum simultaneously for both modes of vibration.

Figure 10B:
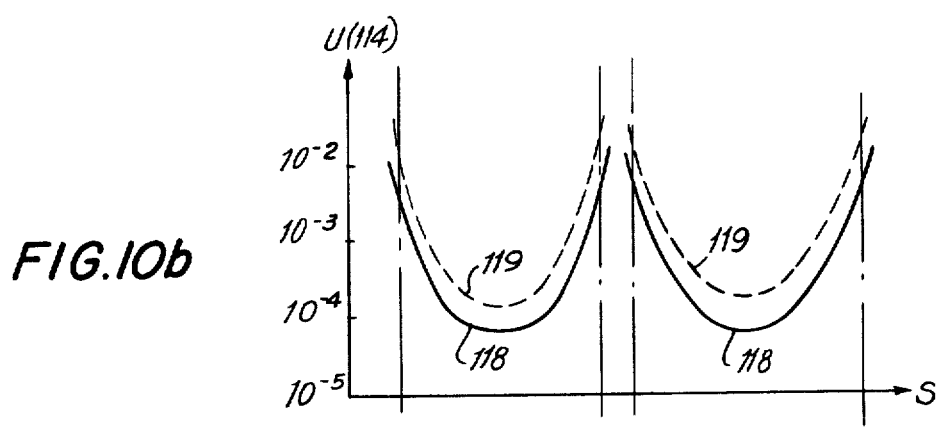
Figure 10C:
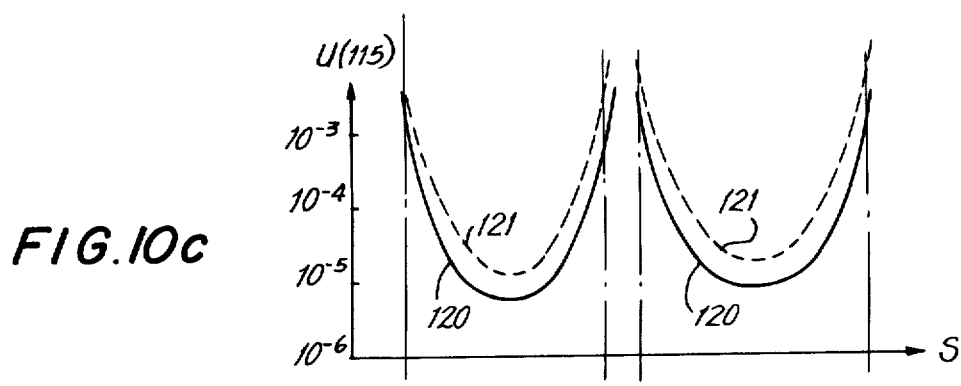

FIG. 10b shows the displacement of the point 114 versus the straight length S. The ordinate axis represents a relative value comparing the displacement at the point 114 with a maximum displacement at the free end of the tuning fork arm. The displacement at the free end of the tuning fork arm is considered to be 1.0. Curve 118 shows the displacements due to the flexural vibration and curve 119 shows the displacement caused by the torsional vibration. FIG. 10c shows the displacement amounts at the point 115 versus the straight length S. The ordinate axis is the same as that used in FIG. 10b. Curve 120 shows the displacement caused by the flexural vibration and curve 121 shows the displacements due to the torsional vibration of the resonator leaf.

Figure 10D:
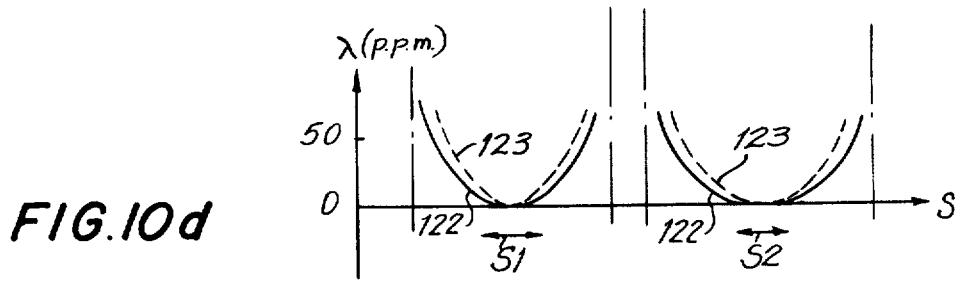

FIG. 10d shows graphs of λ versus S, the straight length of the support member. λ is defined as follows:

$$\lambda = \frac{f_{FREE} - f_{CLAMP}}{f_{CLAMP}}$$

Where $f_{FREE}$ is the resonant frequency of the vibrator leaf when the plug 113 is entirely free, that is unrestrained. The term $f_{CLAMP}$ is resonant frequency of the leaf when the plug 113 is entirely clamped or fixed in place. Thus, λ reflects the effect on the resonant frequency by restraining the plug 113.

The curve 122 (FIG. 10d) shows the displacement in the flexural vibrational frequency and curve 123 shows the change in torsional vibrational frequency resulting from clamping of the plug 113. The abscissa of FIGS. 10a,b,c,d are all illustrated to the same scale. In FIG. 10a, it is shown that variations in the resonant frequencies of the resonator leaf are small when the straight S of the support members is varied in the ranges S1 and S2. Outside of these ranges of S, the variations in frequency are extremely large and the frequency is unstable. If the mounting portion of the resonator, that is, the portion where the supporting members 111 are attached with solder, is entirely fixed, the frequency of torsional and flexural vibration is constant regardless of the value of S, straight length of the support members. However, because there are, in fact, vibrations at that region, a coupling between the supporting members and the resonator leaf occurs. Namely, the coupling between the supporting member and the resonator leaf is especially high in the zones, not S1 or S2, where the frequency is unstable or jumps. Further, within the ranges S1 and S2, variation of frequency is small with changes in S because the coupling between the supporting members and resonator leaf decreases.

As shown in FIG. 10b, the displacement of the point of contact 114 between the supporting memers 111 and plug 113 is small when S is in the ranges S1 or S2. The displacement rapidly increases in those ranges of S other than S1 and S2. In other words, in the ranges of S where coupling between the resonator leaf and the supporting members is weak, the point 114 is substantially a node, and in the ranges S where the coupling is strong, the displacements at point 114 are high.

As shown in FIG. 10c, the displacement of the point 115 at the lower edge of the plug 113 also decreases in the ranges of S where the point of contact 114 is approaching the node. The displacement at point 115 rapidly increases in the ranges of S where the point of contact 114 is approaching high displacements. This is quite natural when it is considered that the plug 113 is caused to vibrate by the supporting members 111 and the point of contact 114 is at the interface between the supporting members 111 and the plug 113. Corresponding with FIGS. 10a and FIG. 10c, in the range of S where the vibrational amplitude of the plug is small, coupling between the supporting members 111 and the resonator leaf 110 is weak. Even if S is varied within the preferred ranges S1, S2, the variation of the resonant frequencies is small. In those ranges of S, where the vibration amplitude of the plug 113 is large, coupling is strong and the frequency of the resonator changes suddenly and significantly when S is varied. Thus, when S is in the range S1 or in S2, the vibrational amplitude of the plug 113 is small. When considering the entire vibration system comprising the resonator leaf, 110, the supporting members 111 and the plug 113, the equivalent mass of the plug 113 is effectively increased. Accordingly, even if another mass is then added to the plug 113, the variation in frequency of the total vibrational system is extremely small and the acoustic leak or energy loss is extremely small.

On the other hand, when the straight length S is in a range other than S1 and S2, the vibrational amplitude of the plug 113 increases. Accordingly, if another mass is added to the plug 113 in that condition, the frequency of the total vibrating system, that is, the leaf 110, support members 111 and plug 113 decreases substantially. That is, an acoustic leak occurs which causes the frequency of the resonator leaf to be substantially reduced.

As shown in FIG. 10c, displacement of the plug 113 is small in the ranges S1 and S2 for both the flexural mode of vibration and the torsional mode of vibration. Accordingly, acoustic leakage is prevented for both modes. This is indicated in FIG. 10d. Where another mass is added or comes in contact with the plug 113, the boundary conditions which are practically realized lie between the conditions where the plug 113 is completely free and where the plug 113 is completely fixed. So, when λ is small, even if another mass is added to the plug 113, the change in the frequency is small relative to the frequency when no mass is added. In other words, acoustic leakage is small. This effect is illustrated in FIG. 10d where, in the ranges S1 and S2, the changes in both the flexural vibration and torsional vibrational frequencies are extremely small and both modes of vibration are isolated from acoustic leakage or energy loss.

Figure 11A:
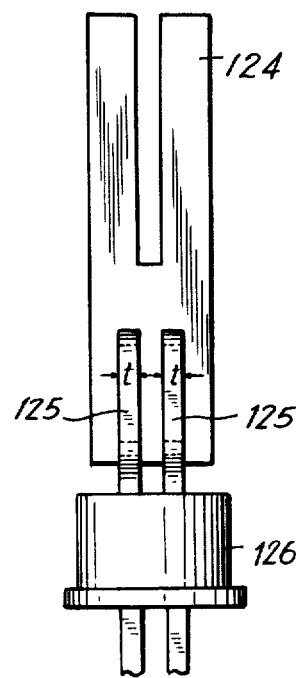
FIGS. 11a,b, 12a,b, 13a,b are front and side views respectively of alternative embodiments of mounted mode coupled tuning fork type quartz crysal resonators in accordance with this invention.
Figure 11B:
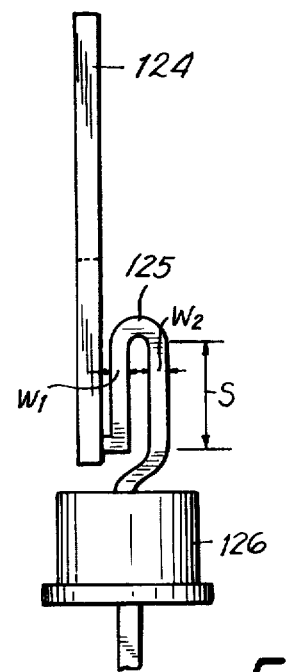
Figure 14:
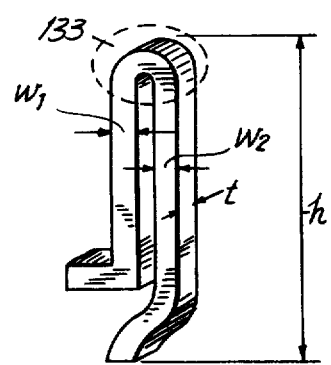
FIG. 14 illustrates the dimensions of the support members of FIGS. 13a,b.

FIGS. 11a,b, 12a,b and 13a,b are other alternative embodiments of mounted mode coupled tuning fork type quartz crystal resonator in accordance with this invention. Front and side views are shown in the a and b Figures respectively. The resonators include a mode coupled tuning fork type quartz crystal resonator leaf 124, 127, 130 and supporting members 125, 128, 131, connected to a plug 126, 129, 132 respectively. In the construction of these embodiments, the principle which has been applied for the prevention of acoustic leakage is the same as described in connection with the embodiment of FIG. 9. FIG. 14 shows a dimensional basis which can be used in association with all of the supporting members 111, 125, 128, 131 used in the embodiments in accordance with this invention shown in FIGS. 9, 11, 12, 13. All supporting members have a portion 133 (FIG. 14) which is turned or bent through an angle of 180 degrees. When a supporting member having this bent portion has a height h, a width of the inside element of w1, a width of the outside element of w2 and a thickness t, practical values of these dimensions are as follows when the support members are carbon steel or Kovar.

h = 400 to 2,600 microns
w1 and w2 = 100 to 200 microns
t = 100 to 400 microns

Figure 12A:
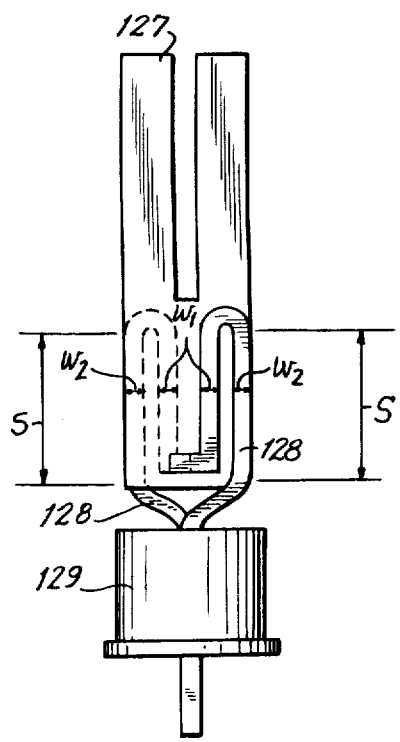
Figure 12B:
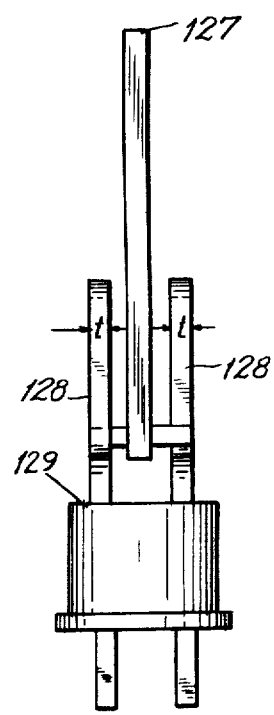
Figure 13A:
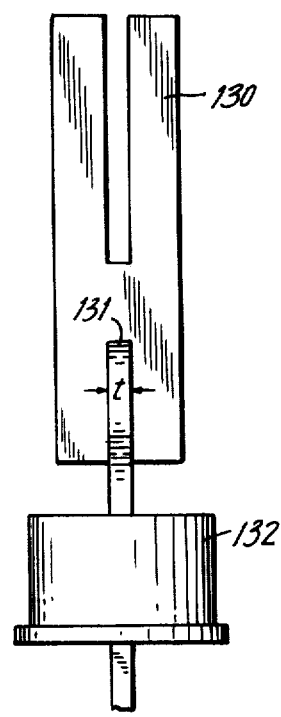
Figure 13B:
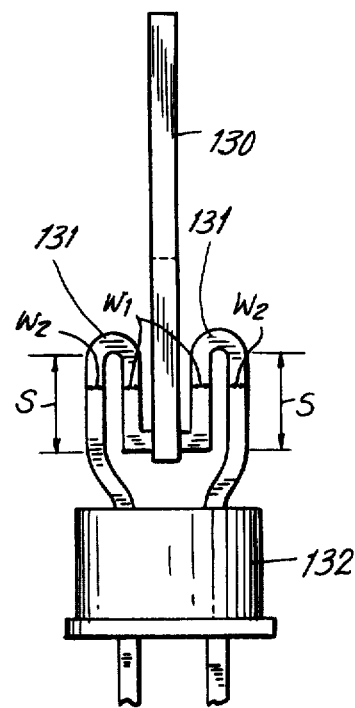

In FIG. 9 and in FIGS. 11a,b, a pair of supporting members 111, 125 respectively having 180 degree bends are respectively attached to one major surface of the resonator leaf 110, 124, that is, on the same broad surface of the leaf. In FIGS. 12a,b and 13a,b, the two supporting members 128, 131 respectively having 180 degree bends are respectively attached to opposite major surfaces of the resonator leafs 127, 130, that is, two opposite sides of the leaf. In both cases, the effects are the same with respect to the prevention of acoustic leakage. The major surface of a leaf means the face of the resonator leaf where, when viewed, the two tuning fork arms are visible, that is, the FIGS. 12a, 13a. There are two such major surfaces on each resonator leaf. Further, the isolation from acoustic leakage is equally effective when more than one bend of a 180 degrees is made in a support member.

Figure 15:
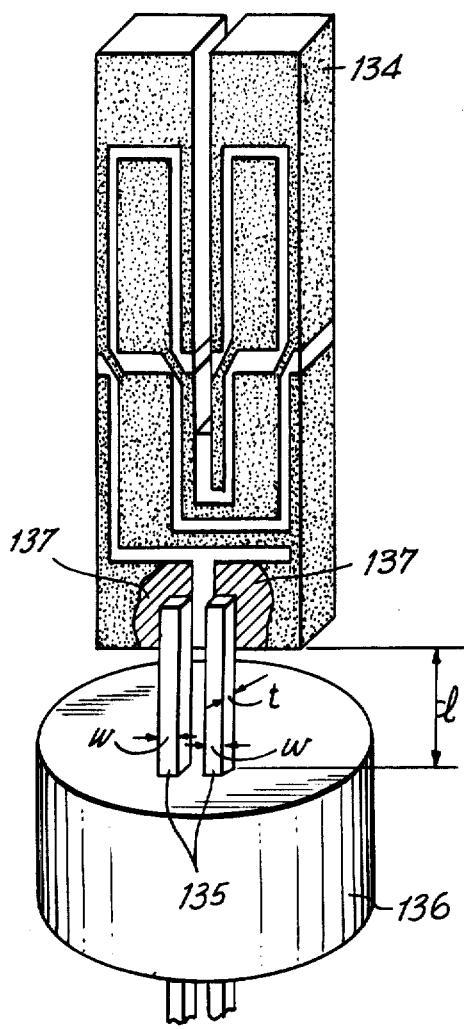
FIGS. 15 and 16 are perspective views of alternative embodiments of mounted mode coupled tuning fork type quartz crystal resonators in accordance with this invention.

FIG. 15 shows another alternative embodiment of a mounted mode coupled tuning fork type quartz crystal resonator in accordance with this invention which includes a mode coupled tuning fork type quartz crystal resonator leaf 134, a pair of supporting members 135, a plug 136 and solder 137 joining the support members 135 to resonator leaf 134. This embodiment differs from the embodiments as described above in that the resonator leaf 134 is supported by two supporting members 135 which have no bent portion. This construction is as effective in preventing acoustic leakage as the embodiments described above wherein the support members are bent through 180 degrees. This is accomplished by properly dimensioning the support members 135 such that the vibration energy of the resonator leaf 134 is not transmitted to the plug 136. The characteristics of FIGS. 10a–d apply to the mounted resonator in accordance with this invention of FIG. 15 wherein l of FIG. 15 corresponds to S in FIGS. 10a,b,c,d. The support members 135 are both attached to the same major surface of the resonator leaf 134.

Figure 16:
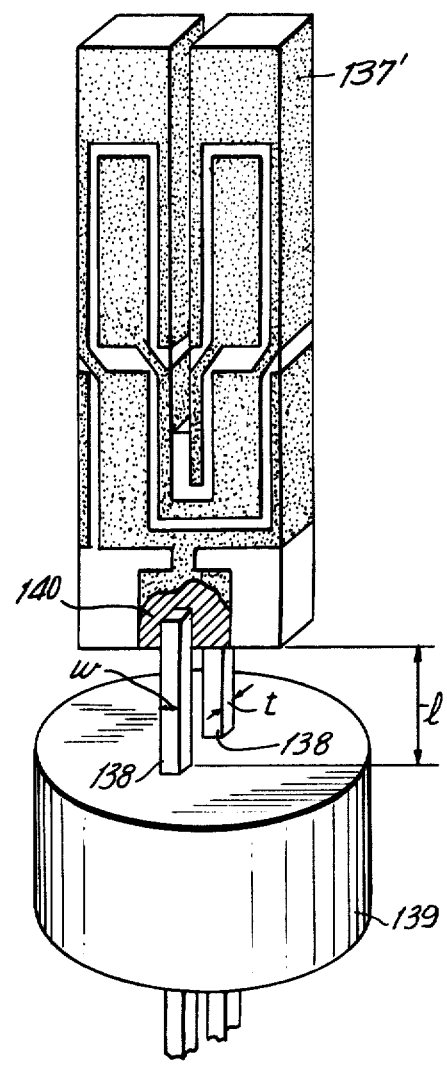

FIG. 16 is another alternative embodiment of a mounted mode coupled tuning fork type quartz crystal resonator in accordance with this invention including a mode coupled tuning fork type quartz crystal resonator leaf 137', a pair of straight supporting members 138, a plug 139, and solder 140 joining the resonator leaf 137' to the plug 139. In this embodiment, the two supporting members 138 are attached to opposite major surfaces of the resonator leaf 137'. The effects of l is the same in the embodiment of FIG. 16 as in the embodiment of FIG. 15 with the respect to the prevention of acoustic leakage. In practical applications, the dimensions are in the following ranges when the support members are carbon steel or Kovar.

w = 0.05 to 0.3 mm
t = 0.05 to 0.3 mm
l = 0.2 to 1.0 mm

Figure 17A:
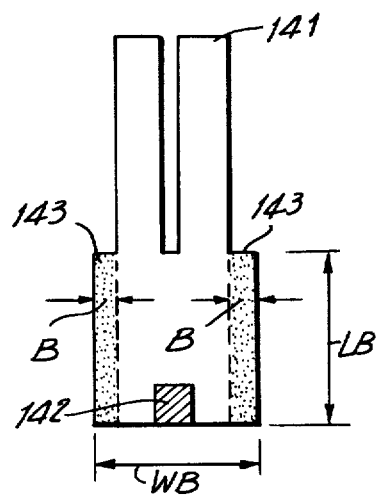
FIG. 17a is a side elevational view of a mode coupled tuning fork type quartz crystal resonator leaf in accordance with this invention.
Figure 17B:
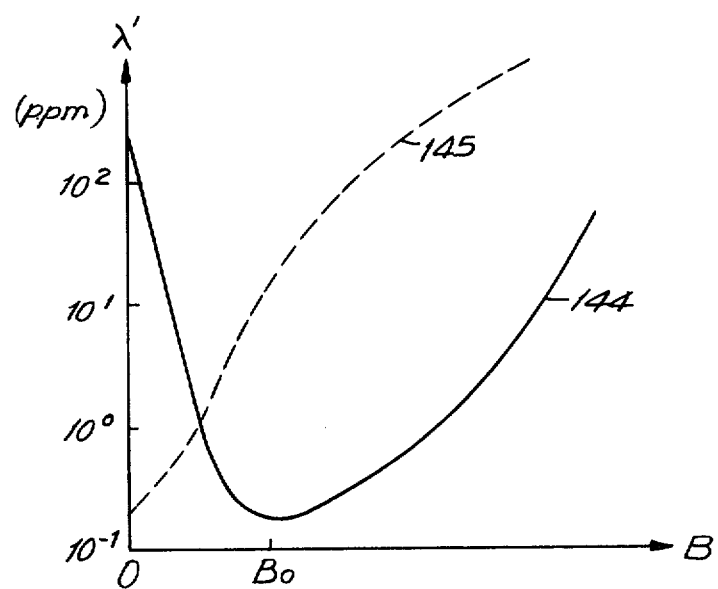

In the embodiments in accordance with this invention as described above, acoustic leakage of the flexural vibrational mode and of the torsional vibrational mode are suppressed to a degree such that this leakage is insignificant in practical applications. However, considering the dispersion in dimensional tolerances in the manufacturing processes, it is very necessary to suppress as much as possible the acoustic leakage and to improve the Q values. To achieve that purpose, the displacements at the mounting portion of the resonator leaf needs to be decreased to a minimum. FIG. 17a shows a mode coupled tuning fork type quartz crystal resonator leaf 141 having portions 143 extending laterally from the base portion, which is that portion excepting the two tuning fork arms. Shaded mounting portion 142 indicates where the support members are attached to the resonator leaf 141. In FIG. 17a the resonator leaf 141 has a base portion with a length LB, a width WB and a width B of the laterally extended portions 143. FIG. 17b shows $\lambda'$ in relation to variation in the width B of the convex portions 143. $\lambda'$ is defined as in equation (1) above except that clamping or free refers to the portion 142. The curve 144 represents the effect $\lambda'$ versus the dimension B for the flexural mode of vibration. The curve 145 represents a similar characteristic for the torsional mode of vibration. As shown in FIG. 17b, $\lambda'$ is a minimum in flexure at a position Bo but $\lambda'$ increases continuously with an increase in B for the torsional mode of vibration.

It is desirable to have $\lambda'$ be equal or less than one part per million (ppm) for both modes and this is not easily accomplished from the shape of the curves as shown in FIG. 17b and the shape of the resonator leaf 141 of 17a.

Figure 18A:
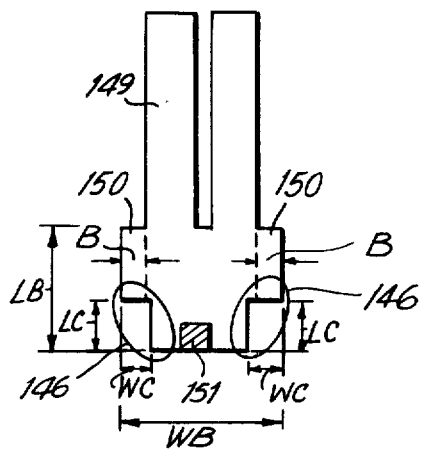
FIG. 18a is a side elevational view of an alternative embodiment of a mode coupled tuning fork type quartz crystal resonator in accordance with this invention.
Figure 18B:
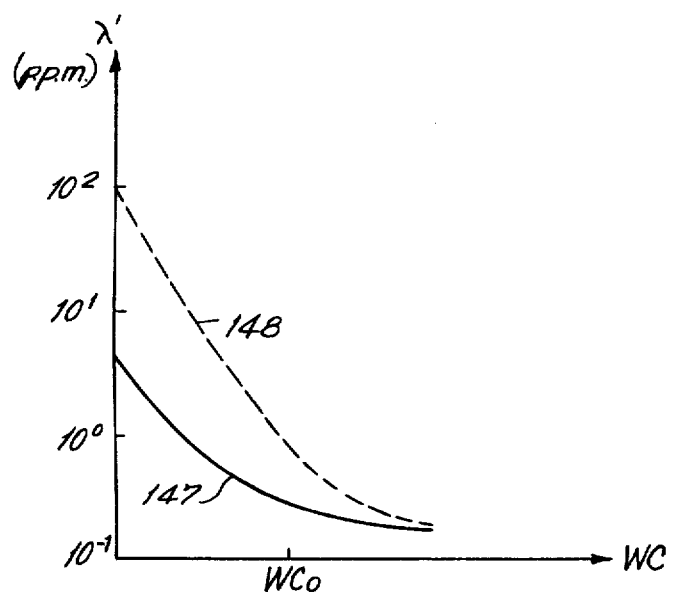

To overcome this difficulty the contours as shown in FIG. 18a are considered. The mode coupled tuning fork type quartz crystal resonator leaf 149 includes portions 150 extending laterally from the base portion of the resonator leaf 149 and having a width B. The laterally extended portions 150 of width B is on the upper part of the base portion of the resonator leaf 149, and a recess or cut-away portion 146 having a length LC and width WC, is located on the lower part of the base portion. The length of the entire base portion is designated as LB, and the width of the base portion including the lateral extensions 150 is designated as WB. FIG. 18b indicates values of $\lambda'$ when LB, WB and B have respectively provided minimum points on similar curves, and when the dimension WC is changed after a proper selection of LC. Curves 147, 148 show respectively the dependence of $\lambda'$ on the dimension WC for both the flexural and torsional modes of vibration. In FIG. 18b, it is shown that the condition that $\lambda'$ be equal or less than one ppm is satisfied when WC is greater than WCo. This condition is satisfied for both modes of vibration. The fact that the difference between the frequency of resonance is small when the mounting portion 151 of the resonator leaf 149 is unrestrained as compared to when it is clamped means that the physical displacement of the mounting portion 151 is small. This brings about the same condition as that described in relation to FIGS. 10c,d wherein displacement of the plug is said to be small in the range where λ is small.

Accordingly, when a resonator is given a shape as in FIG. 18a, displacement of the mounting portion 151 decreases against the two modes of vibration and coupling between the resonator leaf 149 and the supporting members (not shown in FIG. 18a) is substantially less than in the cases illustrated in FIGS. 9-11, 12, 13, 15 and 16. When such a laterally extending/recessed construction for the resonator leaf is used, the curves 116, 117 of FIG. 10a becomes smoother. The minimum value for the curves 118-121 of FIGS. 10b,c are less, and in FIG. 10d, the range of S where λ is small is widened. As a result, acoustic leakage can be almost entirely prevented. Further, due to the fact that the range of S where λ is small, expands as compared to FIG. 10d, indicates that an acoustic leak does not occur even when dispersion in the manufacturing processes causes variations in S. Accodingly, such a vibrator leaf construction and mounting is effective for mass production. The effect of using a resonator shaped as shown in FIG. 18a on the characteristics of FIG. 10a-d are shown in FIGS. 19a-d respectively. In FIGS. 19a-d, a resonator leaf of the contours as shown in FIG. 18a is supported with support members attached and as shown in FIG. 9. Figs. 19a-d correspond respectively to FIGS. 10a-d. The actual curves having primed reference numerals in FIGS. 19a-d correspond to similar curves in FIGS. 10a-d having the same reference numeral. It can be seen in the FIGS. 19a-d that the ranges of straight length S1' and S2' are broader than the corresponding ranges S1 and S2 of FIGS. 10a-d. Also, the minimum value of the curves in the FIGS. 19b,c are less than the corresponding values of the curves in FIGS. 10b,c.

Similar beneficial effects of a resonator contoured as in FIG. 18a are achieved when using the support constructions as shown in FIGS. 11a,b, 12a,b, 13a,b, 15 and 16. In the ranges of S1' and S2', λ is approaching zero and the acoustic leakage is substantially eliminated for both torsional and flexural modes of operation. The ranges of S1' and S2' are in the order of 400 to 500 microns, which are large enough to accept any dispersions in S due to manufacturing processes. Experimentally, λ equal or less than 0.5 ppm for the flexural mode of operation, and equal or less than 5.0 ppm for the torsional mode of operation are achieved and there is no difficulty in making a practical application.

With reference to FIG. 18a, a mode coupled tuning fork type quartz crystal resonator leaf in accordance with this invention and having a thickness of 200 microns or less has dimensions as follows:

LB = 500 to 2,000 microns
WB = 400 to 1,500 microns
B = 30 to 150 microns
LC = 100 to 1,000 microns
WC = 30 to 350 microns A resonator having the contours of FIG. 18a can be easily manufactured using photolithographic processes. When such a resonator of FIG. 18a is supported using a support construction as described above, the Q value of both flexural and torsional vibration is 300,000 or higher. Also, the crystal impedance (CI) of the flexural vibration is 2,000 ohms or less. This results because the physical displacements at the mounting portion 151 is diminished. Because the mounted mode coupled tuning fork type quartz crystal resonator in accordance with this invention has a small acoustic leak, and a high Q value of 300,000 or more, a high oscillation frequency of 200,000 Hz can be used and the aging characteristics of vibration are favorable. There is a great improvement in timekeeping accuracy when a mounted mode coupled tuning fork type quartz crystal resonator in accordance with this invention is applied to an electronic watch. The high accuracy is accompanied by excellent frequency-temperature characteristics. Timekeeping errors in the order of several seconds per year are achieved. Further, when this mounted resonator in accordance with this invention is used in an electronic watch, a large increase of power consumption is prevented because of the low crystal impedance value of 2,000 ohms for the flexural mode of vibration. This is advantageous in terms of providing a long operating life for a battery. When the oscillation frequencies are in the order of 200,000 Hz, the sum total of current for the oscillator circuitry and for the dividing circuitry is in the range of 0.5 to 0.8 microamperes.

The support member constructions and the shapes of the mounted mode coupled tuning fork type quartz crystal resonators in accordance with this invention are also effective in mode coupled tuning fork type quartz crystal resonator using vibrational modes other than the first overtone of flexural vibration. These constructions and shapes are applicable to resonators using vibrational modes other than flexural and torsional. As stated above, when a mounted mode coupled tuning fork type quartz crystal resonator in accordance with this invention is applied in an electronic wristwatch, a wristwatch having greater accuracy and longer life is achieved.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and statements of the scope of the invention which, as a matter of language, might be said to fall therebetween.

What is claimed is:

1. A tuning fork type resonator comprising:
   a resonator leaf having a base and arms extending from said base, said resonator leaf having a plurality of vibrational modes, at least two of said vibrational modes being coupled, said coupled modes being a flexural mode and a torsional mode;
   projections extending laterally from the sides of said base, said projections extending at the upper part of said base, not extending from the bottom end of said base;
   notch portions laterally recessed at the lower part of said base including said bottom end;
   a mounting plug;
   resilient support means, said support means being connected at one end thereof to said base where said recessed notch portions narrow the width of said base, and at the other end said resilient support means being connected to said mounting plug.

2. A tuning fork type resonator as claimed in claim 1 wherein said support means includes at least one support member connected to said base, said at least one support member being of extended length and including a first element extending away in one direction from the connection at said base to at least one bend portion, and a second element extending away from said at least one bent portion in a direction opposite to said first direction and connecting to said plug.

3. A tuning fork type resonator as claimed in claim 1, wherein a reversal in direction of 180 degrees in said at least one support member results from said at least one bent portion.

4. A tuning fork type resonator as claimed in claim 3, wherein the distance from the farthest surface of said bent portion from said plug is in a range of 1.0 to 4.5 mm, the widths of said first said second elements are in a range of 0.1 to 0.3 mm, and the thickness of said at least one support member is in a range of 0.1 to 0.3 mm.

5. A tuning fork type resonator as claimed in claim 4, wherein said resonator leaf is quartz crystal, the thickness of said resonator leaf is not greater than 200 microns, and said at least one bent support member is fabricated of carbon steel.

6. A tuning fork type resonator as claimed in claim 3, wherein said resonator leaf is quartz crystal, the thickness of said resonator leaf is not greater than 200 microns and said at least one bent support member is fabricated of Kovar.

7. A tuning fork type resonator as claimed in claim 5, wherein said laterally extended projections have a lateral width not exceeding one-half of the width of said tuning fork arms.

8. A tuning fork type resonator as claimed in claim 5 or 7 wherein said laterally extending projections taper from a maximum width at the end away from said extending arms.

9. A tuning fork type resonator as claimed in claim 8, wherein said maximum lateral width does not exceed ⅜ of the width of said tuning fork arms.

10. A tuning fork type resonator as claimed in claim 5 or 6, wherein the inside corners at the free ends of said tuning fork arms are cut off to make a tapered end to said tuning fork arms.

11. A tuning fork type resonator as claimed in claim 10, wherein said tuning fork arms are tapered to a distance not exceeding 1/5 of the length of said tuning fork arms.

12. A tuning fork type resonator as claimed in claim 8 and wherein the inside corners at the free ends of said tuning fork arms are cut off to provide a tapered end for said tuning fork arms.

13. A tuning fork type resonator as claimed in claim 12, wherein said tapered laterally extending projections have a maximum width not exceeding ⅜ of the width of a tuning fork arm and said tapered portion of said arms extends not more than 1/5 of the length of said tuning fork arm.

14. A tuning fork type resonator as claimed in claim 5 or 9, wherein said resonator leaf is the product of a photolithographic process.

15. A tuning fork type resonator as claimed in claim 8, wherein said resonator leaf is the product of a photolithographic process.

16. A tuning fork type resonator as claimed in claim 10, wherein said resonator leaf is the product of a photolithographic process.

17. A tuning fork type resonator as claimed in claim 12, wherein said resonator leaf is the product of a photolithographic process.

18. A tuning fork type resonator as claimed in claim 3, wherein the number of said support members is at least two, at least two of said support members being connected to the same surface of said base of said resonator leaf.

19. A tuning fork type resonator as claimed in claim 3, wherein the number of said support members is at least two, at least two of said support members being connected to different surfaces of said base of said resonator leaf.

20. A tuning fork type resonator as claimed in claim 19, wherein said surfaces are opposite one to the other.

21. A tuning fork type resonator as claimed in claim 18 or 20, wherein said surfaces are the major surfaces of said base.

22. A tuning fork type resonator as claimed in claim 13 wherein said leaf is quartz crystal having a thickness not exceeding 200 microns, said base has a length in the range of 500 to 2,000 microns and a width in the range of 300 to 1500 microns, said projections extend laterally in a range of 10 to 350 microns, and said recessed match portions have a length in a range of 30 to 1,000 microns, and a width in a range of 10 to 350 microns.

23. A tuning fork type resonator as claimed in claim 1 wherein said support means includes at least one support member connected to said base, said at least one support member being straight and of extended length, said length being in a range of 200 to 1,000 microns, said at least one support member having a width in the range of 50 to 300 microns, and thickness in the range of 50 to 300 microns, said length being that portion of said at least one support member extending beyond the lower edge of said base.

24. A tuning fork type resonator as claimed in claim 23, wherein the number of said support members is at least two, two of said support members being attached to the same surface of said base portion.

25. A tuning fork type resonator as claimed in claim 23, wherein the number of said support members is at least two, and two of said support members are connected on opposite surfaces of said base.

26. A tuning fork type resonator as claimed in claims 23, 24 or 25, wherein said leaf is quartz crystal having a thickness not exceeding 200 microns, said base has a length in the range of 500 to 2,000 microns and a width in the range of 300 to 1500 microns, said lateral projections extend laterally in a range of 10 to 350 microns, and said recessed notch portions have a length in a range of 30 to 1,000 microns, and a width in a range of 10 to 350 microns.

27. A tuning fork type resonator as claimed in claims 23, 21 or 25, wherein said resonator leaf is quartz crystal, said leaf being shaped by a photolithographic process.

28. A tuning fork type resonator as claimed in claim 26, wherein said resonator leaf is quartz crystal, said leaf being shaped by a photolithographic process.

* * * * *